(12) United States Patent
Hershberg et al.

(10) Patent No.: US 9,979,376 B2
(45) Date of Patent: May 22, 2018

(54) INTEGRATED TUNABLE IMPEDANCE NETWORK

(71) Applicant: IMEC VZW, Leuven (BE)

(72) Inventors: Benjamin Poris Hershberg, Leuven (BE); Barend van Liempd, Leuven (BE)

(73) Assignee: IMEC VZW, Leuven (BE)

( * ) Notice: Subject to any disclaimer, the term of this patent is extended or adjusted under 35 U.S.C. 154(b) by 222 days.

(21) Appl. No.: 14/971,597

(22) Filed: Dec. 16, 2015

(65) Prior Publication Data

US 2016/0182004 A1    Jun. 23, 2016

(30) Foreign Application Priority Data

Dec. 19, 2014 (EP) .................................... 14199406

(51) Int. Cl.
| | | |
|---|---|---|
| H03H 7/38 | (2006.01) | |
| H03H 7/40 | (2006.01) | |
| H03M 1/80 | (2006.01) | |

(52) U.S. Cl.
CPC ............... *H03H 7/383* (2013.01); *H03H 7/40* (2013.01); *H03M 1/80* (2013.01)

(58) Field of Classification Search
CPC .................................. H03H 7/38; H03H 7/40
USPC .......................................... 333/17.3, 32, 33
See application file for complete search history.

(56) References Cited

U.S. PATENT DOCUMENTS

2004/0121745 A1    6/2004    Meck
2009/0066443 A1    3/2009    Kawai et al.
2009/0128386 A1    5/2009    Meynants et al.
2011/0043285 A1    2/2011    Zhao et al.
2014/0159987 A1    6/2014    Robert et al.

FOREIGN PATENT DOCUMENTS

CN          103337717 A          10/2013

OTHER PUBLICATIONS

European Search Report, European Patent Application No. 14199406, dated May 22, 2015.
Kawai, Kunihiro et al., "5-GHz-Band Center Frequency and Bandwidth Tunable Dual-Band Bandpass Filter", Proceedings of the 42nd European Microwave Conference, Oct. 29-Nov. 1, 2012, Amsterdam, Netherlands, pp. 261-264.
Kawai, Kunihiro et al., "Multi-Mode RF Front-End Circuit", Proceedings of the 41st European Microwave Conference, Oct. 10-13, 2011, Manchester, UK, pp. 222-225.

*Primary Examiner* — Stephen E Jones
(74) *Attorney, Agent, or Firm* — McDonnell Boehnen Hulbert & Berghoff LLP

(57) ABSTRACT

A tunable impedance network includes at least one variable impedance bank comprising a plurality of digitally controlled unit cells each connected from at least a first end to a routing wire. The tunable impedance network is provided with selection means arranged for selecting, based on a desired impedance, a corresponding predetermined digital control signal to be supplied to the variable impedance bank to switch-on a corresponding combination of the unit cells. Between each pair of unit cells in the variable impedance bank, a routing wire section is provided having a respective routing impedance. Each of the predetermined digital control signals is provided for switching-on a combination of unit cells in such a way that the routing impedance of the routing wire section is exploited to fine-tune the actual impedance generated by the variable impedance bank.

14 Claims, 7 Drawing Sheets

INTEGRATED TUNABLE IMPEDANCE NETWORK

CROSS-REFERENCE TO RELATED APPLICATIONS

The present application is a non-provisional patent application claiming priority to European Patent Application No. 14199406.1 filed Dec. 19, 2014, the contents of which are hereby incorporated by reference.

FIELD OF THE DISCLOSURE

The present disclosure relates to a tunable impedance network and a method for tuning the impedance of a network.

BACKGROUND

In the design of electronic devices, impedance matching between the input impedance of an electrical load and the fixed output impedance of the signal source to which it is ultimately connected is of crucial importance to ensure the correct functionality of the device. Efficiency of power transmission between a source and a load may be reduced by power reflection from the load back to the source. In other words, if the impedance between a source and a load is not correctly matched, only a portion of the power is ultimately transferred to the load while the remaining power is reflected back to the source. This is a problem in the design of high-frequency electronics where it is desired that the radio frequency power is efficiently transmitted into the load so as to minimize extra power loss and signal distortion, which may negatively impact the overall performance of the system.

One method to ensure that the load receives adequate power is to increase the power transferred from the source to the load, so that the load, by means of brute force, receives adequate power. However, this method provides greater reflected power and exacerbates damage to the power source.

An alternative solution is to provide between the source and the load an impedance matching network, which may be designed such that the impedance of the source is matched to the impedance of the load. In this way, an efficient transmission of power between the source and the load can be effected while minimizing power reflection. In many applications, the impedance of the source or the load may vary over time, thereby requiring the impedance matching network to be tunable so as to ensure the efficient transmission of power between the source and the load. This may be achieved by providing a tunable impedance network containing one or more tunable impedance sub-networks, such as the one shown in FIG. 1. The conventional tunable impedance network 10 of FIG. 1 consists of a metal wire 11 and a slidable impedance element 13 that can be moved continuously up and down the wire 11. By sliding the impedance element $Z_{TUNE}$ 13 up and down the length of the wire 11, as indicated by the arrows, the impedance parameters seen at the two ports of the tunable impedance network 10 can be adjusted.

Such a tunable impedance network is not suitable for integrated circuit solutions due the large area overhead required for its implementation and the need for manual control of the slidable impedance element 13. Similar functionality can be approximated with a discrete set of switchable impedance elements in a switched capacitor array. By switching one of the elements, a capacitor can essentially be moved up and down along the wire. While this solution of moving an impedance up and down a wire is technically feasible, it is very inefficient. It requires a large layout and number of unit elements, all of whom generate a certain amount of harmonic distortion (even when switched off) due to various unavoidable non-linear capacitances present in the physical layout. Furthermore, the tuning range may be quite limited, since the inductance of the wire may be less than a nano-Henry, depending on the frequency, even for a relatively long length of integrated wire.

Using such a switchable capacitor array as a conventional digital-to-analog converter (DAC), e.g. a thermometer-coded DAC, may provide a much larger tuning range. The maximum amount of capacitance that can then be connected to the wire is then $n*C_{UNIT}$. However, the capacitance connected to the wire is influenced by routing inductance of the wire, which may, together with process variations, affect the precision of the switched capacitance, which is of crucial importance when the tunable impedance network is used for impedance balancing in electrical-balance duplexers. In this frequency-flexible type of duplexer, the basic concept is to create a so-called balance network impedance, the complex impedance value of which enables destructive signal interference at the receive output of a hybrid transformer. Specific to this application is the need of an extremely high accuracy in the impedance, as well as a high number of degrees of freedom or independently tuned impedances that enable highly accurate signal cancellation at an output of the duplexer.

Thus, there is a need for additional fine tuning of such a variable impedance bank.

SUMMARY

Embodiments of the present disclosure provide an integrated impedance tunable network with additional fine-tuning.

According to embodiments of the present disclosure, a tunable impedance network is provided. The tunable impedance network is provided with at least one variable impedance bank including a plurality of digitally controlled unit cells each connected from at least a first end to a routing wire in a parallel configuration and arranged when switched-on to adjust the impedance of the variable impedance bank by a discrete value. For example, the unit cells may include a digitally controlled capacitor, which when activated adjusts the impedance of the variable impedance bank by its nominal value. The tunable impedance is provided with selection means including a plurality of predetermined digital control signals each corresponding to a desired impedance. The selection means are arranged for selecting based on the desired impedance the corresponding digital control signal to be supplied to the bank to switch-on a corresponding combination of the unit cells. The tunable impedance network is designed such that between each pair of unit cells in the bank a routing wire section is provided having a routing impedance, which contributes to the actual impedance generated by the variable impedance bank. Each of the predetermined control signals is provided for switching-on a combination of unit cells in such a way that the routing impedance of the routing wire section is exploited to fine-tune the actual impedance generated by the variable impedance bank.

By exploiting the routing impedance contributed by the routing wire section provided between each pair of switched-on unit cells, the actual impedance generated may be fine-tuned in the digital domain without the need for increasing the design complexity or increasing the area overhead of the impedance network. This is because, by taking advantage of the routing impedance of each wire section, the actual impedance generated by the variable impedance bank may be fine-tuned without the need for providing additional components for this purpose, e.g., unit cells with a higher resolution to adjust the impedance of the variable impedance bank by a smaller discrete value, which may considerably increase the area overhead and design complexity of the tunable impedance network. Moreover, the use of smaller unit cells in the variable impedance bank may negatively impact the tuning range of the actual impedance generated due to parasitics introduced in the layout of the unit cells. Therefore, by taking advantage of the routing impedance of the wire sections the actual impedance generated may be fine-tuned at a higher precision than the one defined strictly by the resolution of the unit cells in the variable impedance bank, without the need for providing unit cells having a higher resolution.

According to embodiments of the present disclosure, each predetermined control signal may be provided for exploiting the impedance of the routing wire section to improve the precision of the actual impedance generated by the variable impedance bank.

By exploiting the impedance contributed by the routing wire sections, the precision of the actual impedance generated may be enhanced in the digital domain, without the need for adding higher resolution unit cells to the variable impedance bank, which may result in increased design complexity and larger overhead. This may be achieved by providing, for each desired impedance, a control signal to switch-on a combination of unit cells, which are connected to one another by routing sections, each having a predetermined routing impedance, which, when combined with the impedance adjustments effected by each switched-on unit cell, generate an actual impedance that more closely matches the desired impedance. Therefore, by taking advantage of the routing impedance of the routing sections connecting the predetermined switched-on unit cells, the impedance of the tunable impedance network may be tuned at a higher precision than the one defined strictly by the resolution of the unit cells in the variable impedance bank, without the need for providing unit cells having a higher resolution. Furthermore, in embodiments according to this disclosure, the level of precision of the impedance generated may be further enhanced by giving at least some of the routing wire sections provided between each pair of unit cells a predetermined routing impedance. This may be achieved by means of a predetermined length of at least some of the routing wire sections, or by adding inductive components such as a loop to at least some of the routing wire sections.

According to embodiments of this disclosure, each predetermined control signal may be provided for exploiting the process variability of each unit cell so as to improve the precision of the actual impedance generated by the variable impedance bank. By exploiting the process variability of the unit cells, the precision of the actual impedance generated by the variable impedance bank may be adjusted in the digital domain rather than providing unit cells of higher resolution for compensation, which would increase the design complexity and area overhead of the impedance network.

According to embodiments of this disclosure, the control signals are in the form of a weighted coding scheme, such as a thermometer code. In this way, the variable impedance bank may be operated as a weight-coded digital-to-analog converter (DAC). As a result, the tuning range of the variable impedance bank may be significantly increased, while, simultaneously, the fine-tuning capability can be achieved by exploiting the routing impedance and/or the process variability in the ways described above.

According to embodiments of the present disclosure, each predetermined control signal may be provided for exploiting the impedance of the routing wire section to increase the resolution of the variable impedance bank. This can be achieved for example by designing the routing wire sections in such a way that their contribution to the overall impedance provides for a stepwise variation of the generated impedance at a granularity below that of the unit cells.

According to embodiments of the present disclosure, the tunable impedance network is configured for operating in the radio frequency (RF) range, for example for impedance matching in an RF signal line.

BRIEF DESCRIPTION OF THE FIGURES

The disclosure will be further elucidated by means of the following description and the appended figures.

DETAILED DESCRIPTION

Figure 1:
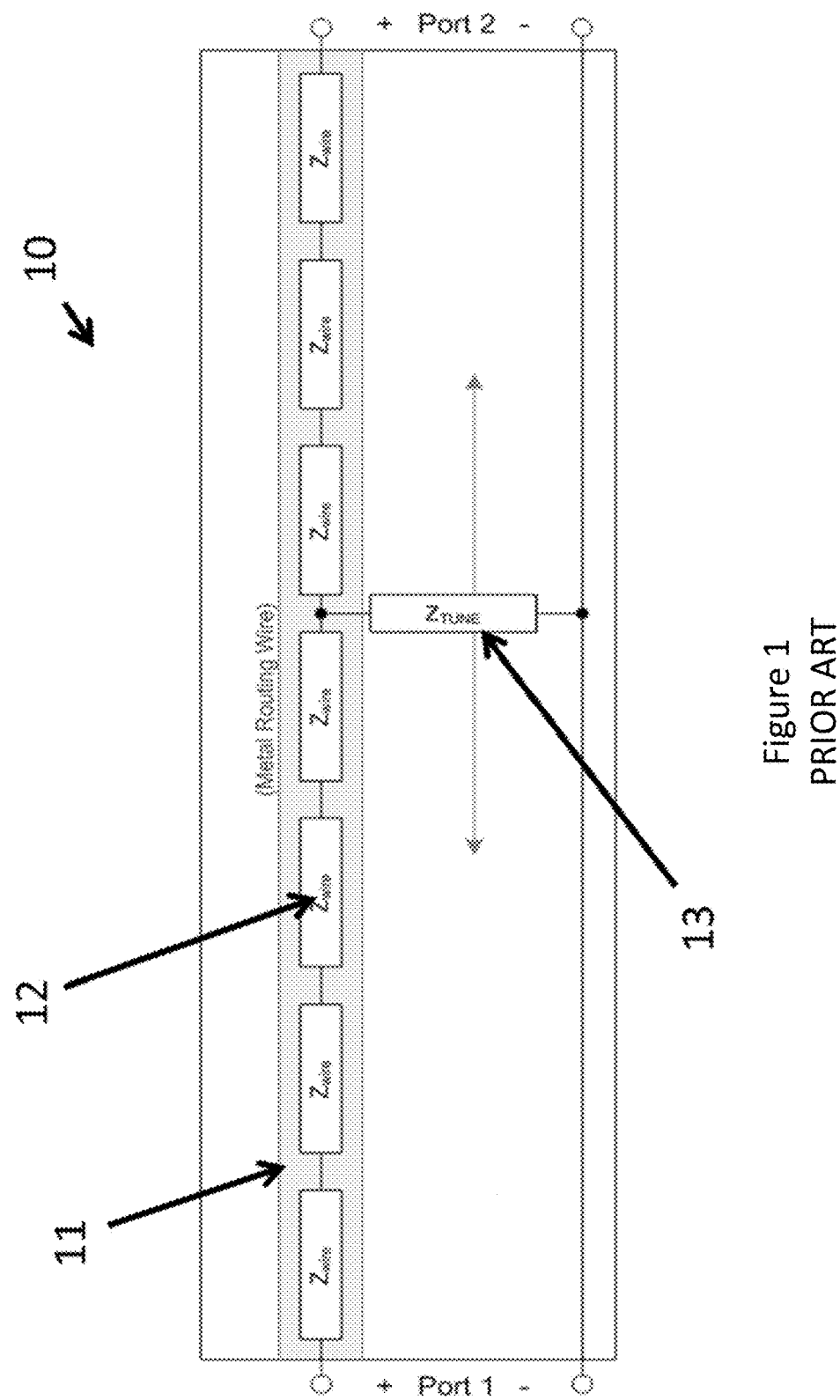
FIG. 1 shows a conventional tunable impedance network.

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

Furthermore, the various embodiments, although referred to as "preferred" are to be construed as exemplary manners in which the disclosure may be implemented rather than as limiting the scope of the disclosure.

The term "comprising", used in the claims, should not be interpreted as being restricted to the elements or steps listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising A and B" should not be limited to devices consisting only of components A and B, rather with respect to the present disclosure, the only enumerated components of the device are A and B, and further the claim should be interpreted as including equivalents of those components.

The present disclosure will be exemplified using the embodiments of FIGS. 1 to 7 with references to the use of the present disclosure in single port impedance tunable networks. It should be noted, that the present disclosure is applicable also to differential port impedance networks.

Figure 2:
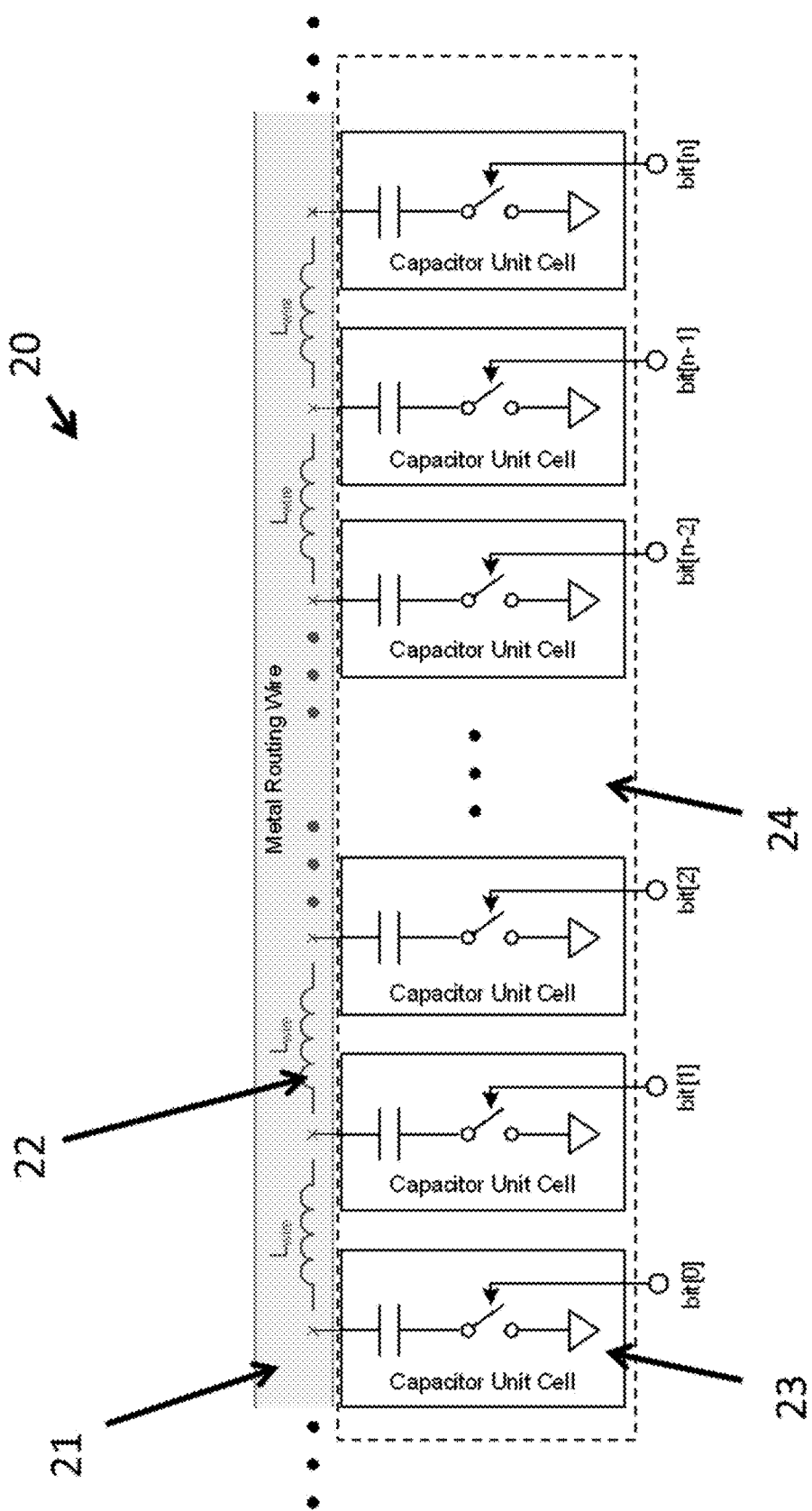
FIG. 2 shows an example of a variable impedance bank according to embodiments of the present disclosure.

According to embodiments of this disclosure, the tunable impedance network 10 of FIG. 1 may be realised in an integrated circuit by providing a variable impedance bank, an example of which is shown in FIG. 2. The variable impedance bank 24 may be provided with an array of digitally controlled unit cells 23 each connected from at least a first end to a metal routing wire 21 and controlled by a control signal. Between each pair of unit cells 23 in the variable impedance bank 23 a routing wire section 22 is provided having a routing impedance, represented in FIG. 2 as $L_{wire}$, which contributes to the actual impedance generated by the variable impedance bank 24. Each of the unit cells 23 may include an impedance element, such as a capacitor, which, when switched-on, adjusts the impedance of the variable impedance bank 24. The impedance element may be operable between the on-state and off-state by means of a digital control signal supplied to a switch, e.g. a transistor, which is provided in series with the impedance element. Therefore, by providing different digital control signals, the activated unit capacitances can be moved up and down the metal wire 21, i.e. a different combination can be selected, thereby adjusting the number of routing wire sections 22 that contribute to the actual impedance generated by the variable impedance bank 24. Accordingly, this principle can be used to fine-tune the impedance of an impedance network 20.

This principle is first further explained for the case where one unit cell is activated. For example, when bit[0] is 1 and all others are 0, the active unit cell is the one on the far left. When bit[n] is selected and all others are 0, the active unit cell is the one on the far right, but all the intermediate wire sections 22 contribute to the overall impedance.

According to embodiments of the present disclosure, the variable impedance bank may be operated in a similar fashion as a digital-to-analog converter (DAC) including a number of unit cells arranged to be operated by a control signal supplied in the form of a thermometer code, or other coding/weighting schemes. In this way, the maximum impedance generated by the variable bank depends on the number of unit cells connected to the wire. Each of the unit cells in the variable impedance bank may be designed to have the same nominal value. For example, in the case where the unit cells include at least one digitally controlled capacitor, each unit cell may have the same nominal capacitance value. The variable impedance bank, if desired, may also be designed so that there are sets of unit cells with a different nominal value.

Figure 3:
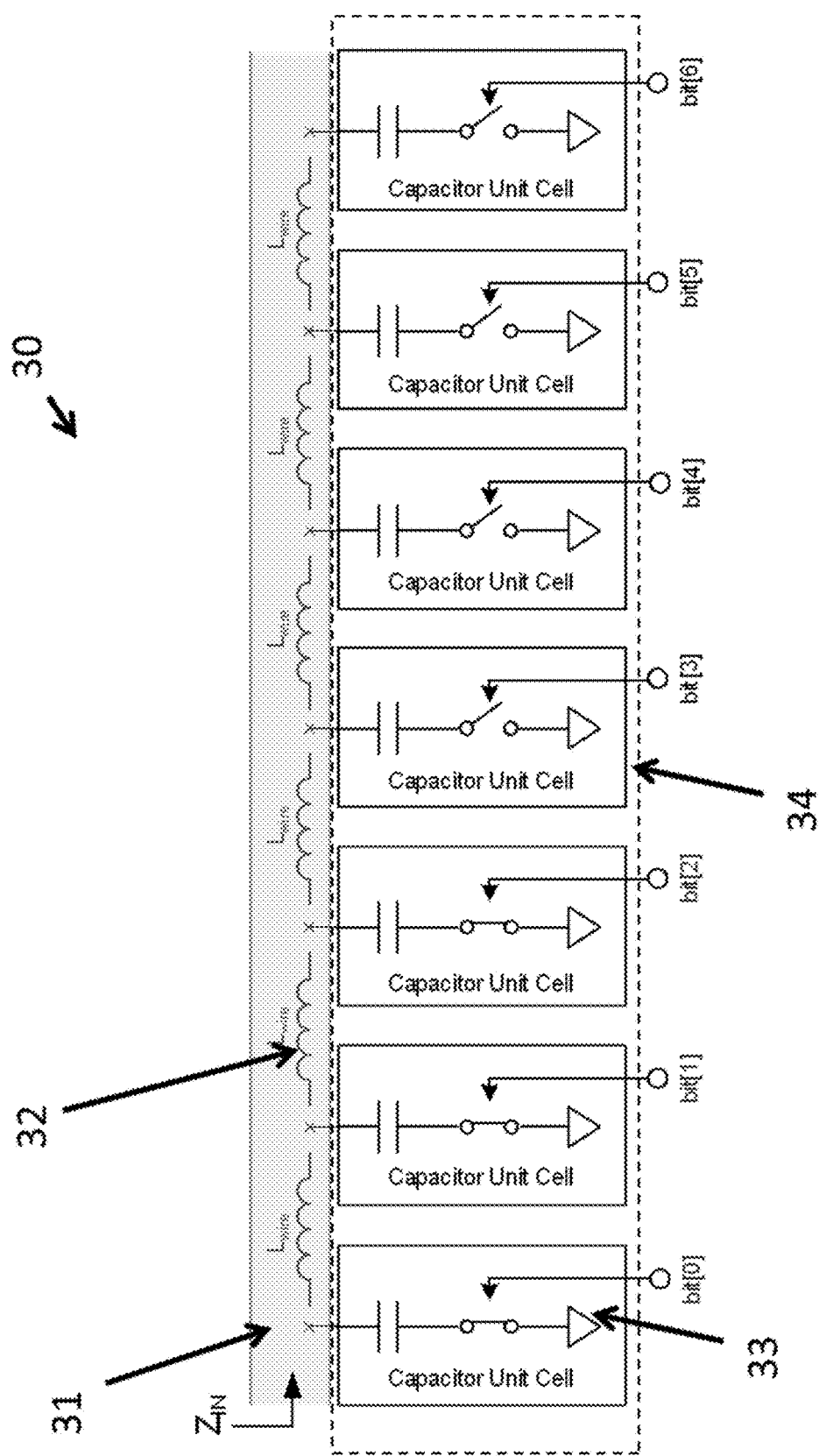
FIG. 3 shows an example of operating the variable impedance bank of FIG. 2 as a thermometer-coded DAC according to embodiments of the present disclosure.

FIG. 3 shows an example of how a variable impedance bank 24 of FIG. 2 may be operated as a thermometer-coded continuous-time DAC, for example a 3-bit variable impedance bank 34 including seven thermometer-coded unit cells 33. The unit cells may be operated by applying a thermometer-coded control signal corresponding to a desired impedance value. For example, as shown in FIG. 3, a thermometer-coded control signal may be applied to the digitally controlled unit cells 33 asserting bits[0] to bit[2] so as to switch-on the corresponding combination of unit cells 33, while maintaining the remaining unit-cells 33 in the variable impedance bank 34 switched-off.

As previously described, the impedance of the routing section provided between each pair of unit cells contributes to the actual impedance generated by the variable impedance bank. Therefore, each time a different combination of unit-cells is switched-on the actual impedance generated may be different due to the different routing impedance of the wire sections connecting the switched-on unit cells. As a result, by exploiting the parasitics in the layout of the tunable impedance network and their known electrical properties, it is possible to fine-tune the actual impedance generated by the variable impedance bank without the need for providing higher resolution unit cells. Such fine-tuning of the actual impedance may be achieved by providing to the variable impedance bank a control code that switches-on a predetermined combination of unit cells, which, in combination with the routing impedance, generate an actual impedance that closely matches the desired impedance.

Figure 4:
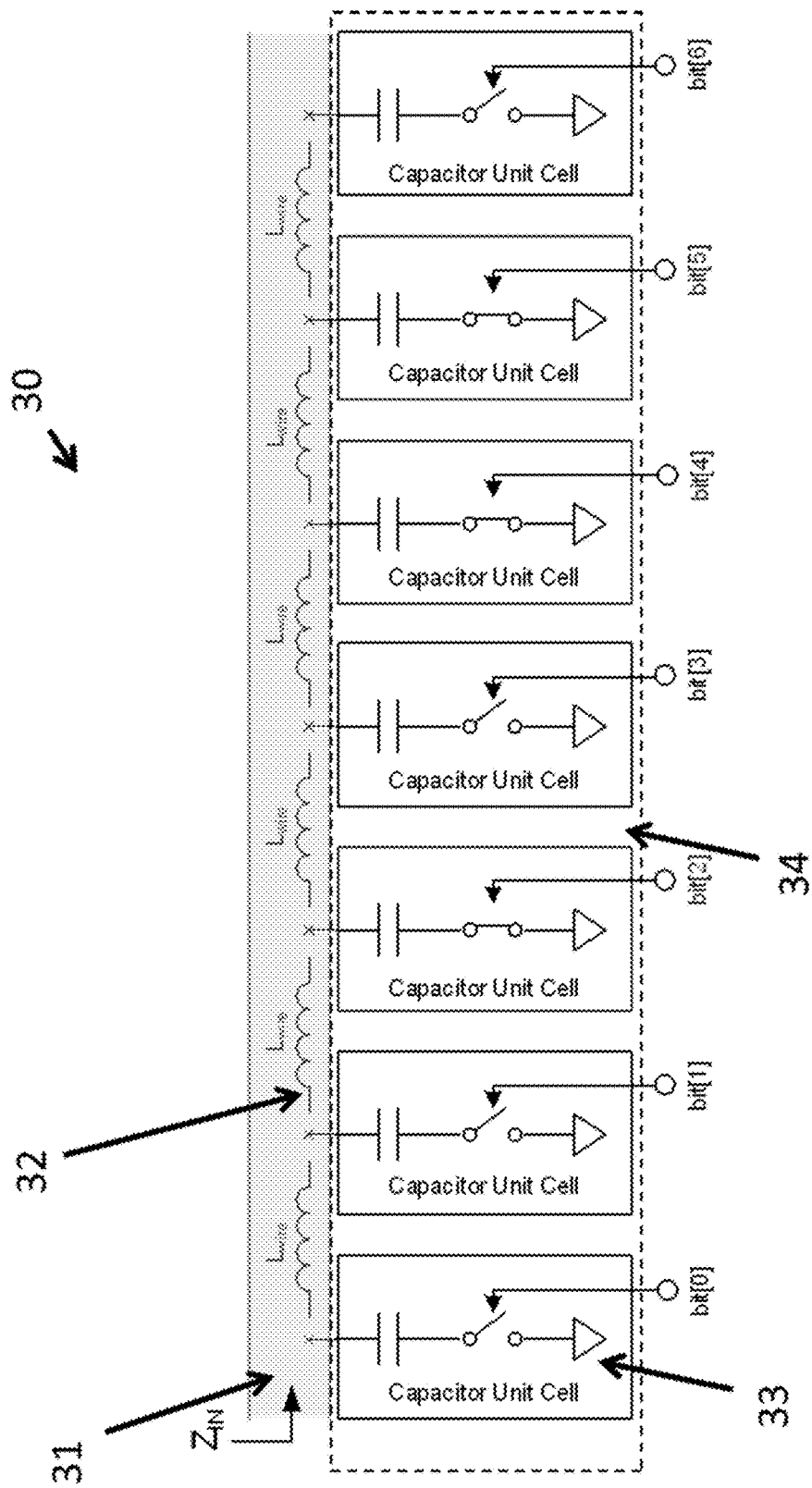
FIG. 4 shows an example of operating the variable impedance bank of FIG. 2 as a thermometer-coded DAC according to embodiments of the present disclosure.

According to embodiments of the present disclosure, the routing impedance contributed by the routing wire section connecting each pair of unit cells, represented in FIGS. 2 to 4 as $L_{wire}$, may be exploited to fine-tune the actual impedance generated by the variable impedance bank, for example when operated as a DAC. For example, the fine-tuning of the actual impedance may be achieved by providing, for each desired impedance, a predetermined control signal, which is each time provided for switching-on a corresponding combination of unit cells so as to generate, in combination with the routing impedance contributed by the routing sections, an actual impedance that is fine-tuned. For example, the actual impedance may be more precise or even of higher resolution that the one provided by the nominal value of the unit cells of the variable impedance bank as described herein. By exploiting the impedance of the routing section connecting each pair of unit cells, the actual impedance generated by the variable impedance bank may be fine-tuned in the digital domain without the need for providing unit cells of higher resolution, which would increase the design complexity and area overhead of the impedance network.

FIG. 4 shows an example of how the 3-bit variable impedance bank 34 of FIG. 3 may be operated so as to exploit the routing impedance of the routing wire section connecting each pair of unit cells to fine-tune the impedance of the tunable impedance network 30. Similarly to FIG. 3, the variable impedance bank 34 is operated in a similar function as a DAC including seven digitally controlled unit cells, arranged for receiving a control signal in the form of a thermometer code, or other coding/weighting schemes. In FIG. 3, a control code of 3, in the binary format, is coded in a conventional and logical way, with bits 0-2 asserted. By contrast, in FIG. 4, the same control code of 3 is generated, but the digital control signals asserted are different, asserting bits 2, 4, and 5 instead. Due to the finite, but small, distributed impedance of the routing wire sections 32 in the physical layout, simplified here as $L_{wire}$, the generated impedance $Z_{IN}$ presented in FIGS. 3 and 4 will be slightly different. This principle is exploited according to this disclosure to fine-tune the overall impedance.

In this way, for each desired impedance, a predetermined control signal may be selected to activate a corresponding combination of unit cells 33 that generate an actual impedance that more closely matches the desired impedance, thereby improving the precision of the actual impedance generated by the variable impedance bank 34. In a similar way, the natural process variability, caused due to the physical process spread and defects, in the matching of the unit cells may be exploited to fine-tune the actual impedance generated by the variable impedance bank 34. In the latter case, a calibration procedure would be applied to determine the most appropriate control signals.

According to embodiments of the present disclosure, the level of fine-tuning of the actual impedance generated by the variable impedance bank may be controlled by the impedance of the routing wire section provided between each respective pair of unit cells. A predetermined impedance may be chosen, for example, by choosing a predetermined length for at least some of the wire routing sections between pairs of cells. For example, by placing the unit cells in the physical layout at a more or less compact spacing relative to each other, the level of the fine-tuning may be adjusted through the adjustment of the value of $L_{wire}$. A compact physical layout may generate a smaller value for $L_{wire}$, while a wider, more distributed, physical layout may generate a larger value for $L_{wire}$. In this way, the length of $L_{wire}$ can be used to set the minimum step precision that can be obtained by exploiting the routing impedance of the wire sections. As an alternative to varying the length, inductive components may be applied in the routing wire sections, such as loops.

The extent to which the precision of the actual impedance generated by the variable impedance bank can be adjusted depends on the thermometer code provided to the unit cells for generating a desired impedance. For example, in the 3-bit example of FIG. 4, if the control code is equal to 0, e.g., all unit cells switched-off, or 7, e.g., all unit cells switched-on, there may be less freedom for adjustment. If the control code is equal to 1, e.g., one unit cell is switched-on, or 6, e.g., six unit cells switched-on, then the number of possible combinations of unit cells to realize the desired impedance value is equal to 8. If the control code is equal to 2, e.g., two unit cells switched-on, or 5, e.g., five unit cells switched-on, then the number of possible combinations of unit cells to realize the desired impedance value is equal to 28. This freedom increases until the mid-codes when the control code is equal to 3, e.g., three unit cells switched-on, or 4, e.g., four unit cells switched-on, which results in 56 or 70 possible combinations of unit cells for realizing the desired impedance value. Therefore, control codes near the mid-code will have the highest potential for precision enhancement. For impedance networks including more than one variable impedance bank (as is often the case), this is less of a problem. In such a case, the digital control scheme can be orchestrated from the viewpoint of the entire tunable network. In many applications, it is quite likely that some of the tunable elements will be set to min or max codes, but very unlikely that all tunable elements will be. In this way, the overall network maintains sufficient flexibility for code-based optimization, even if some elements must be set to values with low code-permutation flexibility.

According to embodiments of the present disclosure, each of the predetermined control signals (unit cell combinations) corresponding to a desired impedance may be pre-selected. The selection of the predetermined digital control signals may be performed by means of a simulation or a calibration process effected prior or during the operation of the impedance network. The impedance network may further include a selection means, for example a selector, including a plurality of predetermined digital control signals each corresponding to a desired impedance. The selector may be arranged for selecting, based on the desired impedance, the corresponding digital control signal to be supplied to the bank to switch-on a corresponding combination of the unit cells so that the impedance generated by the variable impedance bank more closely matches the desired impedance. Alternatively, the selector may iteratively use knowledge of the governing equations and physical arrangement of the impedance network to iteratively tune to the desired actual impedance of the impedance bank in a deterministic way until the desired impedance value is reached. For example, the selector may iteratively select control codes from throughout the complete control code range or a portion of the control code range so as to "slide" each capacitor from left to right, one by one, until the desired value is achieved.

Figure 5:
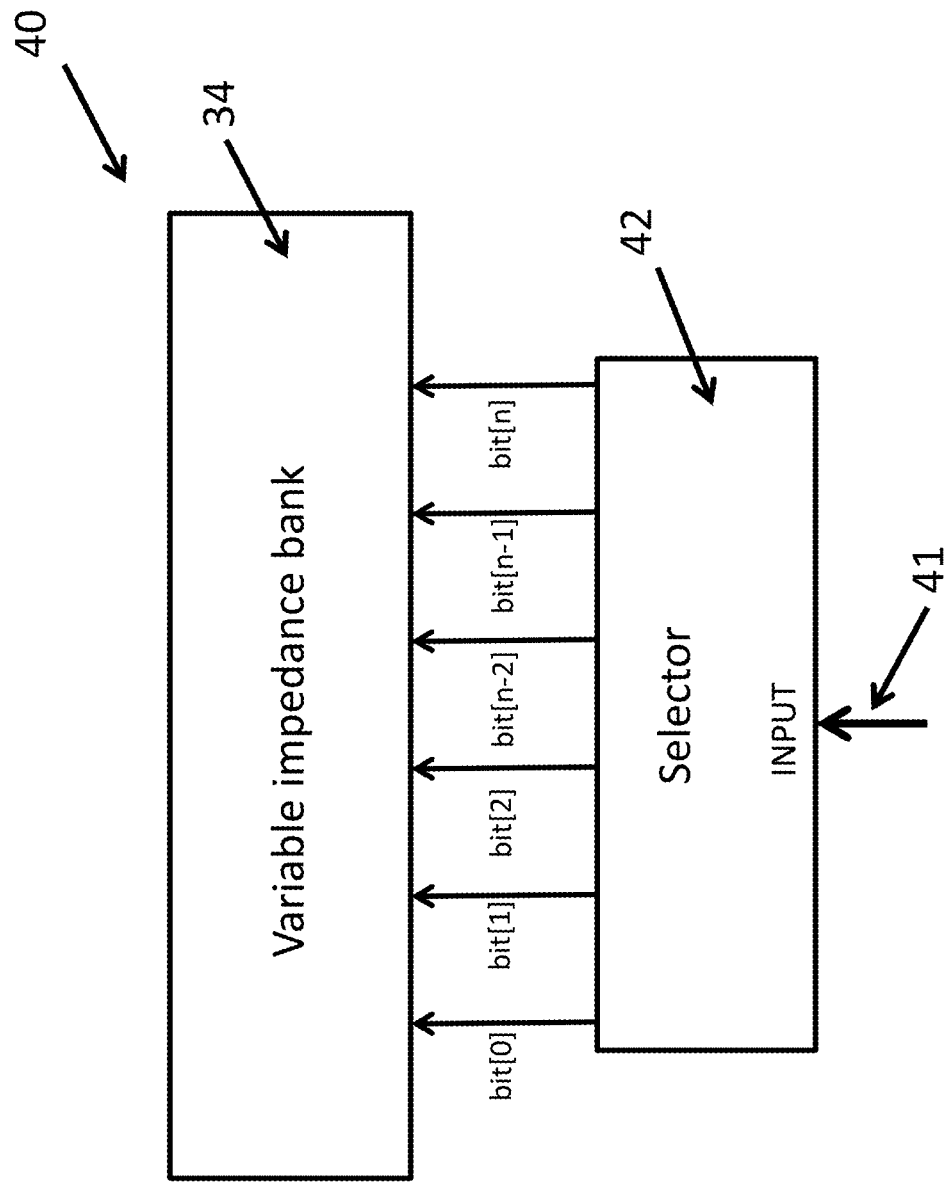
FIG. 5 shows an example of a tunable impedance network according to embodiments of the present disclosure.

FIG. 5 shows an example of an impedance network 40 including a selector 42 arranged for providing to the variable impedance bank 34 a predetermined control signal based on desired impedance 41 received at a selector input. The selector 42 may be arranged for storing the predetermined control signals in a memory, e.g., a Look-up-Table (LUT), and arranged upon receiving a desired impedance value 41 at the input to select the corresponding control signal, which, when applied to unit cells of the variable impedance bank 34, generates an impedance that matches the desired impedance received at the input of the selector 42 as closely as possible. Alternatively, the selector 42 may be part of a closed loop control system that uses knowledge of the governing equations and physical arrangement of the impedance network to iteratively tune the actual impedance of the impedance bank in a deterministic way until the desired impedance value is reached. Control steps using control feedback can be followed to systematically reach the desired control code. The selector 42 is thus arranged for providing to the variable impedance bank a number of control codes each arranged for switching-on a different combination of unit cells, and, based on the actual impedance generated by the bank, select the combination of unit cells that generates an actual impedance closely matching the desired impedance. According to embodiments of the present disclosure, the routing impedance of the wire sections connecting each pair of unit cells may be exploited to increase the resolution of the variable impedance bank. This may be achieved by providing a variable impedance bank operated as a DAC that has a resolution, e.g., the smallest adjustment of impedance effected by the variable impedance bank to the tunable impedance network, at the same level as the fine-tuning step provided by the impedance of the routing wire sections. For example, in the case of FIGS. 3 and 4, although the technical resolution of the control code is only 3-bits, by providing an appropriate digital control signal to switch-on a combination of unit cells 33 corresponding to a desired impedance, it is possible to adjust $Z_{IN}$ at a resolution higher than 3-bits.

Figure 6:
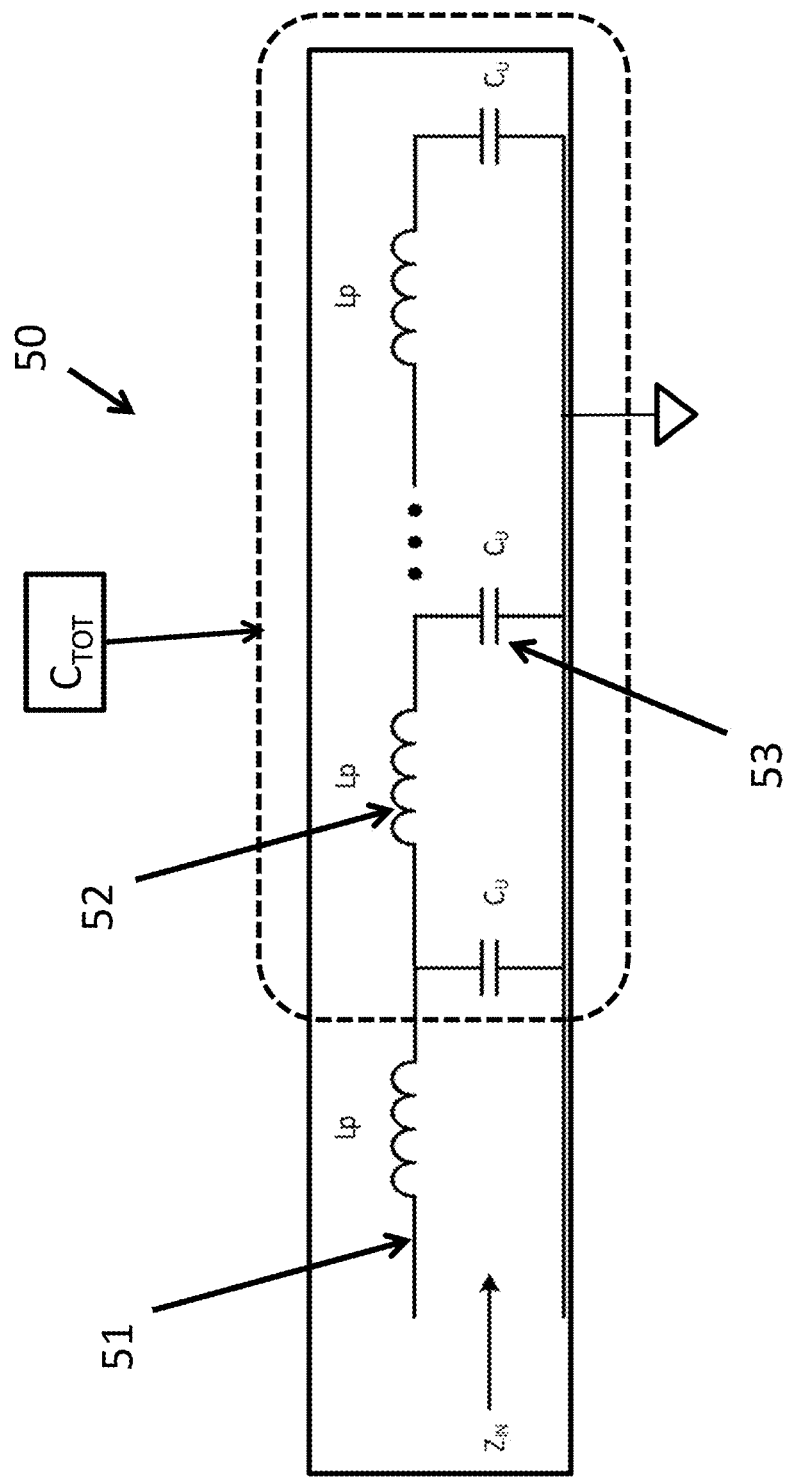
FIG. 6 shows an example of a single port tunable impedance network having a variable impedance bank used for impedance balancing of an electrical network according to embodiments of the present disclosure.
Figure 7:
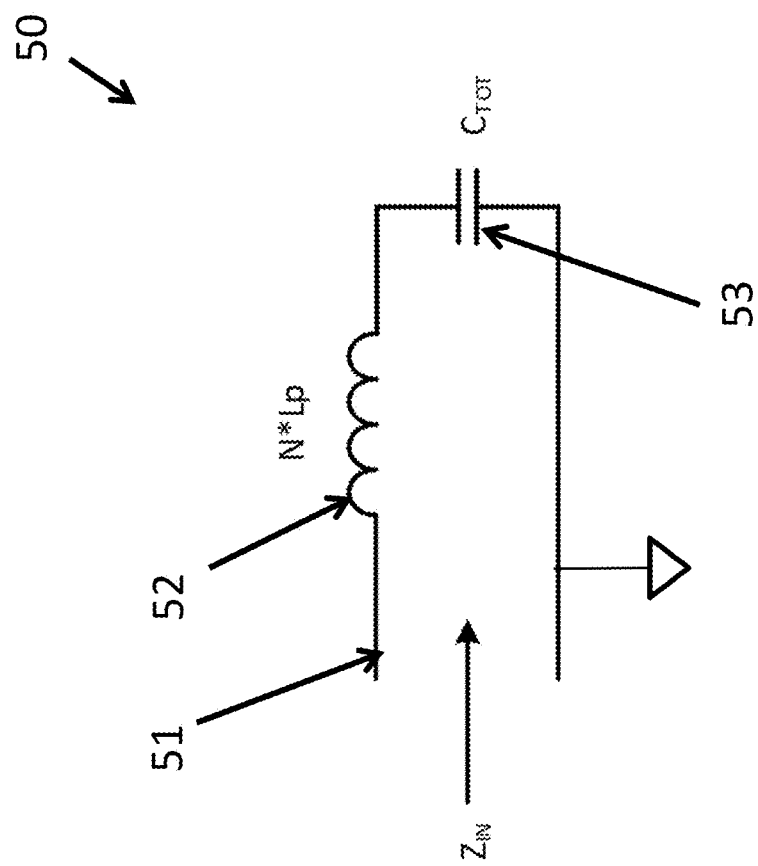
FIG. 7 shows a simplified representation of the single port tunable impedance network of FIG. 6.

This principle of increasing the resolution is exemplified with the aid of the single port tunable impedance network 50 having a variable impedance bank according to embodiments of the present disclosure shown in FIGS. 6 and 7. It should be noted, that the present disclosure is applicable also to differential port impedance networks.

As mentioned above, the impedance generated with the impedance network may be tuned by "shifting" the active unit cells 53 along the routing wire 51. In this way, $C_{TOT}$, which is the sum of the capacitance generated by the switched-on unit cells, may be shifted along the routing wire 51 thereby enabling the generation of any integer multiple of $L_p$, which is the routing inductance of the routing wire section 52 connecting each pair of unit cells 53. To exemplify the operation of the variable impedance bank 50, assume a simple case where all the digitally controlled capacitors 53 are switched-on in the variable impedance bank and are selected in a contiguous block that results in an effective capacitance $C_{TOT}$, which includes all unwanted parasitics contributed among others from the routing wire sections 52 in that part of the variable impedance bank. By switching-on a contiguous sub-set of the digitally controlled capacitors 53, the circuit may be simplified down to two elements, as shown in FIG. 7. $C_{TOT}$ represents the effective bank capacitance, and $L_p$ represents the routing parasitics leading from the RF signal line into the variable impedance bank. $L_p$ may be composed of distributed R, L, and C's, but for this example a dominant L is assumed so as to simplify the analysis. In this example, $Z_{IN}$ as a function of frequency may be defined as:

$$Z_{IN}(s) = sNL_P + \frac{1}{sC_{TOT}}$$

The higher resolution is based on the concept that $L_p$ can be used to shift $C_{TOT}$ to become $C_{TOT}+C_{TOT}/M$, where M determines the desired granularity. For example, if $C_{TOT}$ is generated by a variable impedance bank operated as a 4-bit DAC and a 5-bit precision is required, then M=2^5 would provide the extra precision required without requiring to increase the number of unit cells 53 in the variable impedance bank or to increase the resolution of each unit cell 53. For 8-bit precision, M=2^8, etc. Therefore, the desired and actual input impedances can be set to be equal to each other for N=1:

$$\frac{1}{s\left(C_{TOT} + \frac{C_{TOT}}{M}\right)} = sL_P + \frac{1}{sC_{TOT}}$$

Taking this equation from above and solving for Lp, results in:

$$L_P = \frac{-1}{s^2 C_{TOT}(M-1)}$$

To provide a more practical example, using the equations from above, assume that $C_{TOT}$=5 pF, s=j*2π*1 GHz, and that the $C_{TOT}$ can be controlled to 8-bit precision but a 10-bit precision is required. In this case M=2^10=1024. Solving for $L_p$ using the equation above results in:

$L_p$=4.94 pH

Therefore, using the technique described in the present disclosure the precision of the actual impedance generated by the variable impedance bank 50 may be improved from 8-bit to 10-bit, without the need for increasing the number of unit cells 53 or their respective resolution. As a result, in this way the precision of the variable impedance bank may be improved by using the otherwise unwanted routing impedance of the wire sections provided between each pair of unit cells. The routing parasitic $L_p$ contributed by the routing wire section between the unit cells may be implemented in an integrated circuit using a metal wire having a predetermined length, e.g., 50 micro-meters.

A step or block that represents a processing of information can correspond to circuitry that can be configured to perform the specific logical functions of a herein-described method or technique. Alternatively or additionally, a step or block that represents a processing of information can correspond to a module, a segment, or a portion of program code (including related data). The program code can include one or more instructions executable by a processor for implementing specific logical functions or actions in the method or technique. The program code and/or related data can be stored on any type of computer readable medium such as a storage device including a disk, hard drive, or other storage medium.

The computer readable medium can also include non-transitory computer readable media such as computer-readable media that store data for short periods of time like register memory, processor cache, and random access memory (RAM). The computer readable media can also include non-transitory computer readable media that store program code and/or data for longer periods of time. Thus, the computer readable media may include secondary or persistent long term storage, like read only memory (ROM), optical or magnetic disks, compact-disc read only memory (CD-ROM), for example. The computer readable media can also be any other volatile or non-volatile storage systems. A computer readable medium can be considered a computer readable storage medium, for example, or a tangible storage device.

What is claimed is:

1. A tunable impedance network, configured for operating in the RF frequency range for impedance matching in an RF signal line, comprising:
  at least one variable impedance bank comprising a plurality of digitally controlled unit cells having a same nominal impedance value, each connected from at least a first end to a routing wire in a parallel configuration and arranged when switched-on to adjust an impedance of the variable impedance bank by a discrete value,
  wherein the at least one variable impedance bank comprises at least one set of digitally controlled unit cells, and
  wherein the set of unit cells comprises at least two different nominal impedance values; and
  selection means comprising a plurality of predetermined digital control signals each corresponding to a respective impedance of a plurality of impedances, the selection means being arranged for selecting, based on a desired impedance, a corresponding predetermined digital control signal to be supplied to the variable impedance bank to switch-on a corresponding combination of the unit cells;
  wherein, between each pair of unit cells in the variable impedance bank, a routing wire section is provided having a routing impedance, which contributes to an actual impedance generated by the variable impedance bank;
  wherein each of the predetermined digital control signals is provided for switching-on a combination of unit cells in such a way that the routing impedance contributed by the routing wire sections provided between each pair of switched-on unit cells is exploited so as to fine-tune the actual impedance generated by the variable impedance bank.

2. The tunable impedance network of claim 1, wherein each predetermined digital control signal is provided for exploiting an impedance of the routing wire sections to improve a precision of the actual impedance generated by the variable impedance bank.

3. The tunable impedance network of claim 1, wherein each predetermined control signal is provided for exploiting a process variability of the unit cells to improve a precision of the actual impedance generated by the variable impedance bank.

4. The tunable impedance network of claim 1, wherein each predetermined control signal is provided for exploiting the impedance of the routing wire sections to increase a resolution of the variable impedance bank.

5. The tunable impedance network of claim 1, wherein the plurality of predetermined digital control signals are in the form of a weighted coding scheme, wherein the weighted coding scheme comprises a thermometer code.

6. The tunable impedance network of claim 1, wherein the network comprises means for iteratively selecting among the plurality of predetermined digital control signals based on the actual impedance generated.

7. The tunable impedance network of claim 1, wherein the plurality of unit cells comprises at least one digitally controlled capacitor.

8. The tunable impedance network of claim 1, wherein the variable impedance bank comprises a thermometer-coded digital-to-analog converter (DAC).

9. The tunable impedance network of claim 1, wherein at least one routing wire section comprises a predetermined routing impedance.

10. The tunable impedance network of claim 9, wherein the predetermined routing impedance is provided by a predetermined length of the at least one routing wire section.

11. The tunable impedance network of claim 10, wherein the at least one routing wire section comprises an inductive component, and wherein the predetermined routing impedance is provided by the inductive component.

12. A method for impedance matching in an RF signal line by tuning an impedance of an impedance network configured for operating in the RF frequency range, the method comprising:

providing at least one variable impedance bank comprising a plurality of digitally controlled unit cells having a same nominal impedance value, each connected from at least a first end to a routing wire in a parallel configuration and arranged when switched-on to adjust an impedance of the variable impedance bank by a discrete value, wherein the at least one variable impedance bank comprises at least one set of digitally controlled unit cells, and wherein the set of unit cells comprises at least two different nominal impedance values;

providing, between each pair of unit cells in the variable impedance bank, a routing wire section having a routing impedance, which contributes to an actual impedance generated by the variable impedance bank;

providing selection means comprising a plurality of predetermined digital control signals each corresponding to a respective impedance of a plurality of impedances; and selecting, based on a desired impedance, a corresponding predetermined digital control signal to be supplied to the variable impedance bank to switch-on a corresponding combination of the unit cells so as to tune the impedance of the impedance network;

wherein each of the predetermined digital control signals is provided for switching-on a combination of unit cells such that the routing impedance contributed by the routing wire sections provided between each pair of switched-on unit cells is exploited to fine-tune the actual impedance generated by the variable impedance bank.

13. The method of claim 12, wherein the fine-tuning provides an improved precision and/or an increased resolution of the actual impedance generated by the variable impedance bank.

14. The method of claim 12, wherein the predetermined digital control signals are iteratively selected based on the actual impedance generated.

* * * * *